US006407909B1

(12) United States Patent
Kato et al.
(10) Patent No.: US 6,407,909 B1
(45) Date of Patent: Jun. 18, 2002

(54) TERMINAL UNIT WITH DISPLAY PANEL SHAFT SUPPORT

(75) Inventors: Shinichi Kato; Kenichi Miyazawa; Kazuo Ogashiwa; Noboru Ishii, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/288,694

(22) Filed: Apr. 9, 1999

(30) Foreign Application Priority Data

Jul. 6, 1998 (JP) .......................................... 10-190619

(51) Int. Cl.[7] .............................. G06F 1/16; H05K 5/02
(52) U.S. Cl. ....................................... 361/681; 248/919
(58) Field of Search ................................ 361/681, 682, 361/683, 724, 727; 248/919, 917, 918

(56) References Cited

U.S. PATENT DOCUMENTS 4,571,456 A * 2/1986 Paulsen et al. ............. 179/2 C
4,946,300 A * 8/1990 Makita ....................... 400/682
5,103,377 A * 4/1992 Kobayashi et al. ......... 361/394
5,209,448 A * 5/1993 Hatanaka et al. ........... 248/455
5,534,891 A * 7/1996 Takano ....................... 345/169
5,751,547 A * 5/1998 Honda et al. ............... 361/686
5,796,576 A * 8/1998 Kim ........................... 361/681
6,034,867 A * 3/2000 Seo ............................ 361/683
6,300,921 B1 * 10/2001 Moriconi et al. ............. 345/30

FOREIGN PATENT DOCUMENTS

JP 63-104125 5/1988
JP 8-249540 9/1996

* cited by examiner

*Primary Examiner*—Lynn D. Feild
(74) *Attorney, Agent, or Firm*—Staas & Halsey LLP

(57) ABSTRACT

A terminal unit includes a body unit and a display panel unit which is attached to the body unit in a manner in which an inclination angle of the display unit can be changed. The display panel unit has a shaft. The body unit has a shaft supporting portion which has a cut-out having an entrance portion. The shaft is caused to pass through the entrance portion of the cut-out of the shaft supporting portion and is fitted into a depth portion of the cut-out, the display panel unit thus being attached to the body unit. The direction in which force is applied to the shaft when the display panel unit is operated is different from the center line of the cut-out by a predetermined angle.

9 Claims, 14 Drawing Sheets

FIG.3A
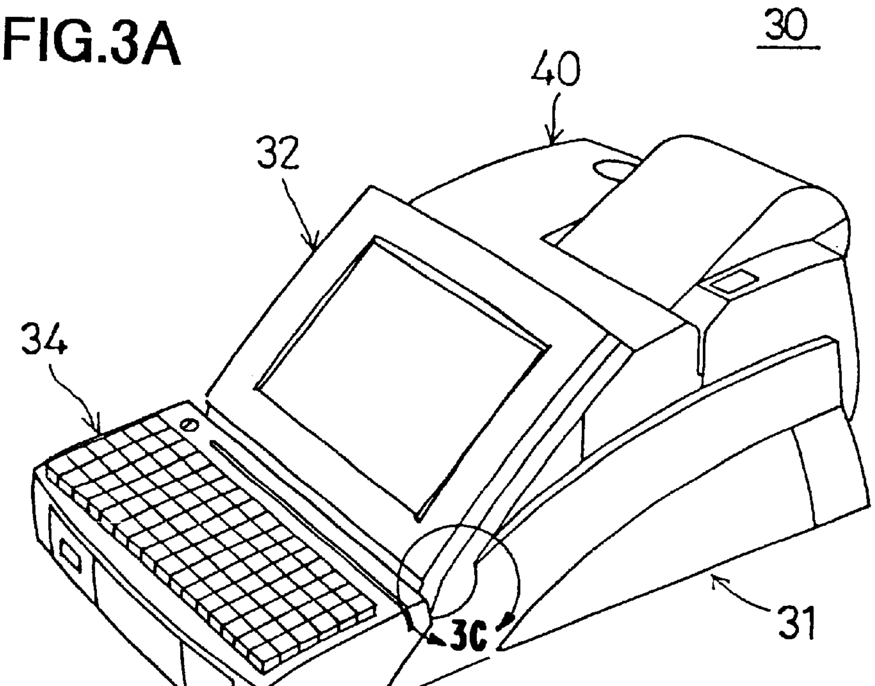
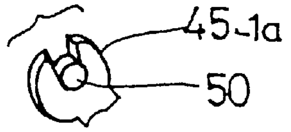
FIG. 3C
FIG.3B
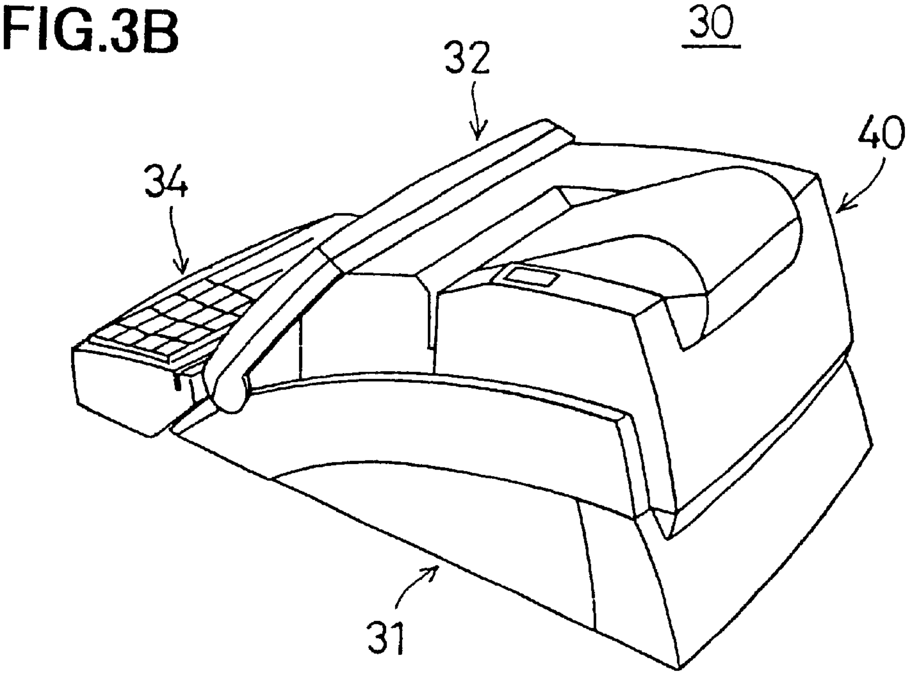

32
50
P2
P1
50b
50c
55e
50f
55b
50i
56e
56b
56c
55
56
56a
50h
b
50j
55c
a
50g
56d
55d
50e
55a
50a
50d
Z1
X2
X1
Z2

52
50
P2
P1
55a
50c
50b
53
51
54
55d
(50e)
Y1
Y2

51
X1
X2

TERMINAL UNIT WITH DISPLAY PANEL SHAFT SUPPORT

BACKGROUND OF THE INVENTION

1. Field of the Invention

The present invention relates to a terminal unit, in particular, a POS (Point Of Sale) terminal unit which has a touch panel, an angle of which panel can be changed.

Such a POS terminal unit is demanded to require reduced man-hours for being assembled in a factory, and, also, easy maintenance of a touch panel thereof.

2. Description of the Related Art

FIGS. 1A, 1B and 1C shows a POS terminal unit 10 in the related art. The POS terminal unit 10 includes a body unit 11 and a display panel unit 12. The left and right sides of the display panel unit 12 are connected to the body unit 11 by using hinge modules 13, and, thus, the display panel unit 12 is attached to the body unit 11, so that the inclination angle of the display panel unit 12 can be adjusted. The display panel unit 12 has a liquid crystal display device, and has a touch panel which covers the display screen of the liquid crystal display device. The angle of the display panel unit 12 is adjusted so that an operator can easily view the display screen of the liquid crystal display device and also can easily operate the display panel unit 12. The operator operates the display panel unit by pushing a desired position of the display screen by using his or her finger.

As shown in FIG. 2, each of the hinge modules 13 includes a fixed-side bracket 20, a fixed-side shaft 22 which is fixed to the fixed-side bracket 20 by using screws 21 and projects from the fixed-side bracket 20, a rotation-side shaft 23 which is connected to the fixed-side shaft 22 and can rotate, a coil spring 24 which is provided over the circumferential surface of the fixed-side shaft 22 and the circumferential surface of the rotation-side shaft 23 and presses the circumferential surface of the fixed-side shaft 22 and the circumferential surface of the rotation-side shaft 23, and a rotation-side bracket 25. The fixed-side bracket 20 of the hinge module 13 is fixed to the body unit 11 by using screws. The rotation-side bracket 25 is fixed to the display panel unit 12 by using screws, and two nail portions **25*a*1 and 25*a*2 of the rotation-side bracket 25 are fitted into a pair of cut-out portions 23*b*1 and 23*b*2 of a flange 23*a* provided at the end of the rotation-side shaft 23, respectively. As mentioned above, the coil spring 24 extends over the circumferential surface of the fixed-side shaft 22 and the circumferential surface of the rotation-side shaft 23, and presses the circumferential surface of the fixed-side shaft 22 and the circumferential surface of the rotation-side shaft 23. As a result, a considerably large torque is required for rotating the rotation-side shaft 23**.

When an operator holds the top of the display panel unit 12 by his or her hand and applies a large force to the display panel unit 12, the rotation-side shaft 23 rubs against the coil spring 24 and rotates. As a result, the inclination angle of the display panel unit 12 is changed. Then, even when the operator removes the hand from the display panel unit 12, the inclination angle of the display panel unit 12 does not change and the display panel unit 12 is maintained in this inclination angle. Even when the operator operates the display panel unit so that the operator pushes a desired position of the display screen of the display panel unit 12 by using his or her finger, the display panel unit 12 is maintained in this inclination angle.

As shown in FIG. 1C, a stand 15 is caused to adhere to the body unit 11 by using a double-sided tape, and a POP (Point Of Purchase) 16 or the like is supported on the stand 15.

In the POS terminal unit 10 in the related art, as mentioned above, the two nail portions **25*a*1 and 25*a*2 of the rotation-side bracket 25, which is fixed to the display panel unit 12 by using the screws, are fitted into the pair of the cut-out portions 23*b*1 and 23*b*2 of the flange 23*a* at the end of the rotation-side shaft 23. Thus, the display panel unit 12 is coupled with the body unit 11**.

The POS terminal unit 10 is assembled in a factory as follows: the display panel unit 12 is in a condition in which a cover **12*a* has not been attached; the rotation-side bracket 25 is fitted to the rotation-side shaft 23; in this condition, the rotation-side bracket 25 is fixed to a body 12*b* of the display panel unit 12; and, then, the cover 12*a* is attached to the body 12*b*. Thus, many man-hours are required for assembling the POS terminal unit 10**. As a result, it is difficult to shorten a period required for the POS terminal unit to be delivered to a customer once an order is made by the customer.

Further, a case in which the POS terminal unit 10 set in a store is maintained will now be considered. For a purpose of maintenance or the like, the display panel unit 12 may be detached from the body unit 11. Further, another display panel unit 12 may be attached to the body unit 11. In such a case, it is necessary to detach the cover **12*a* from the body 12*b*, and loosen the screws by which the rotation-side bracket 25 is fixed to the display panel unit 12**. Thus, many man-hours are required for the maintenance.

Further, the number of parts of the hinge modules 13 is large, and, therefore, the hinge modules 13 are expensive.

SUMMARY OF THE INVENTION

An object of the present invention is to provide a terminal unit in which the above-described problems are solved.

A terminal unit, according to the present invention, comprises:

a body unit; and a display panel unit which is attached to the body unit in a manner in which an inclination angle of the display unit can be changed, wherein:

the display panel unit has a shaft;

the body unit has a shaft supporting portion which has a cut-out having an entrance portion;

the shaft is caused to pass through the entrance portion of the cut-out of the shaft supporting portion and is fitted into a depth portion of the cut-out, the display panel unit thus being attached to the body unit; and the direction in which force is applied to the shaft when the display panel unit is operated is different from the center line of the cut-out by a predetermined angle.

Because the shaft is caused to pass through the entrance portion of the cut-out and is fitted into the depth portion of the cut-out, and, thus, the display panel unit is attached to the body unit, it is possible to attach the display panel unit to the body unit without disassembling the display panel unit. Therefore, it is possible for the body unit and the panel display unit to be assembled separately, and, then, for the thus-assembled display panel unit to be assembled on the thus-assembled body unit. Thus, it is not necessary to disassemble a portion of the assembled display panel unit when the display panel unit is assembled on the body unit. Thus, assembling of the terminal unit is easy, and, thereby, the terminal unit can be delivered within a period shorter than that in the case of the related art. Further, it is possible to detach the display panel unit from the body unit as a result of moving the shaft to the direction of the entrance portion, causing the shaft to pass through the entrance portion, and, thus, removing the shaft from the cut-out. Thus, maintenance of the display panel unit can be easily performed.

Further, because the direction in which force is applied to the shaft when the display panel unit is operated is different from the center line of the cut-out by a predetermined angle, the shaft is pressed against a side wall of the cut-out when the display panel unit is operated, and, thereby, the shaft is prevented from slipping out of the cut-out. As a result, when an operator operates the display panel unit so that the operator pushes the display panel unit, the shaft does not move from the depth portion of the cut-out to the entrance portion, that is, the shaft is maintained in the depth portion of the cut-out. As a result, the portion of the display panel unit which portion is connected to the body unit is not wobbly, and it is possible to stably perform an operation on the display panel unit, that is, push the display panel unit.

Other objects and further features of the present invention will become more apparent from the following detailed description when read in conjunction with the accompanying drawings.

BRIEF DESCRIPTION OF THE DRAWINGS

FIGS. 3A and 3B show a perspective view of a POS terminal unit in a first embodiment of the present invention;

DETAILED DESCRIPTION OF PREFERRED EMBODIMENTS

Figure 1A:
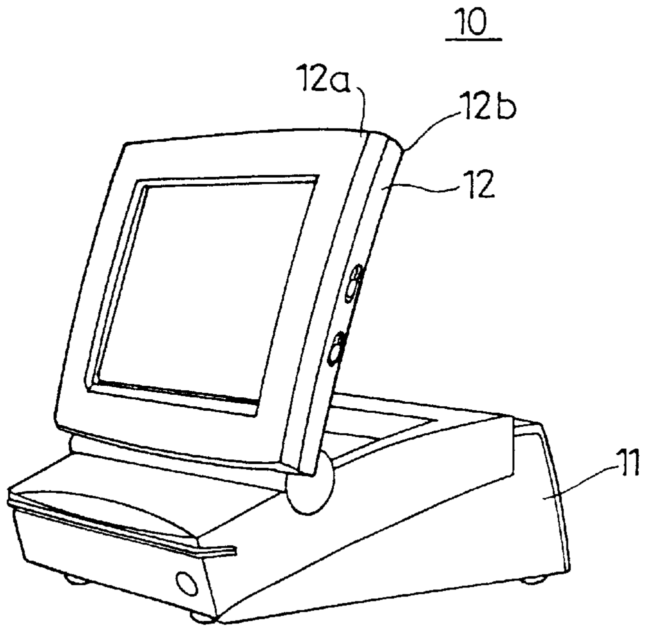
FIGS. 1A, 1B and 1C show a POS terminal unit in the related art.
Figure 1B:
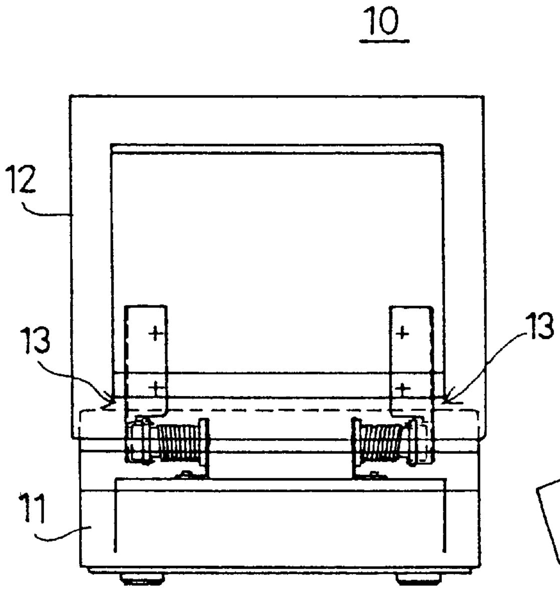
Figure 1C:
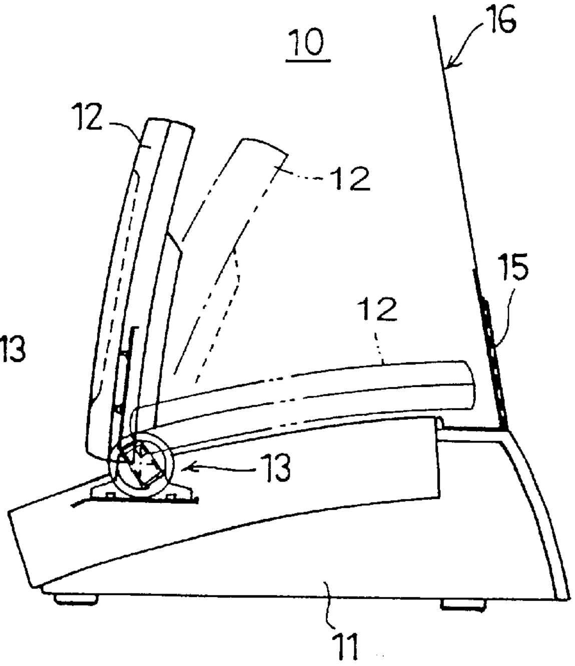
Figure 2:
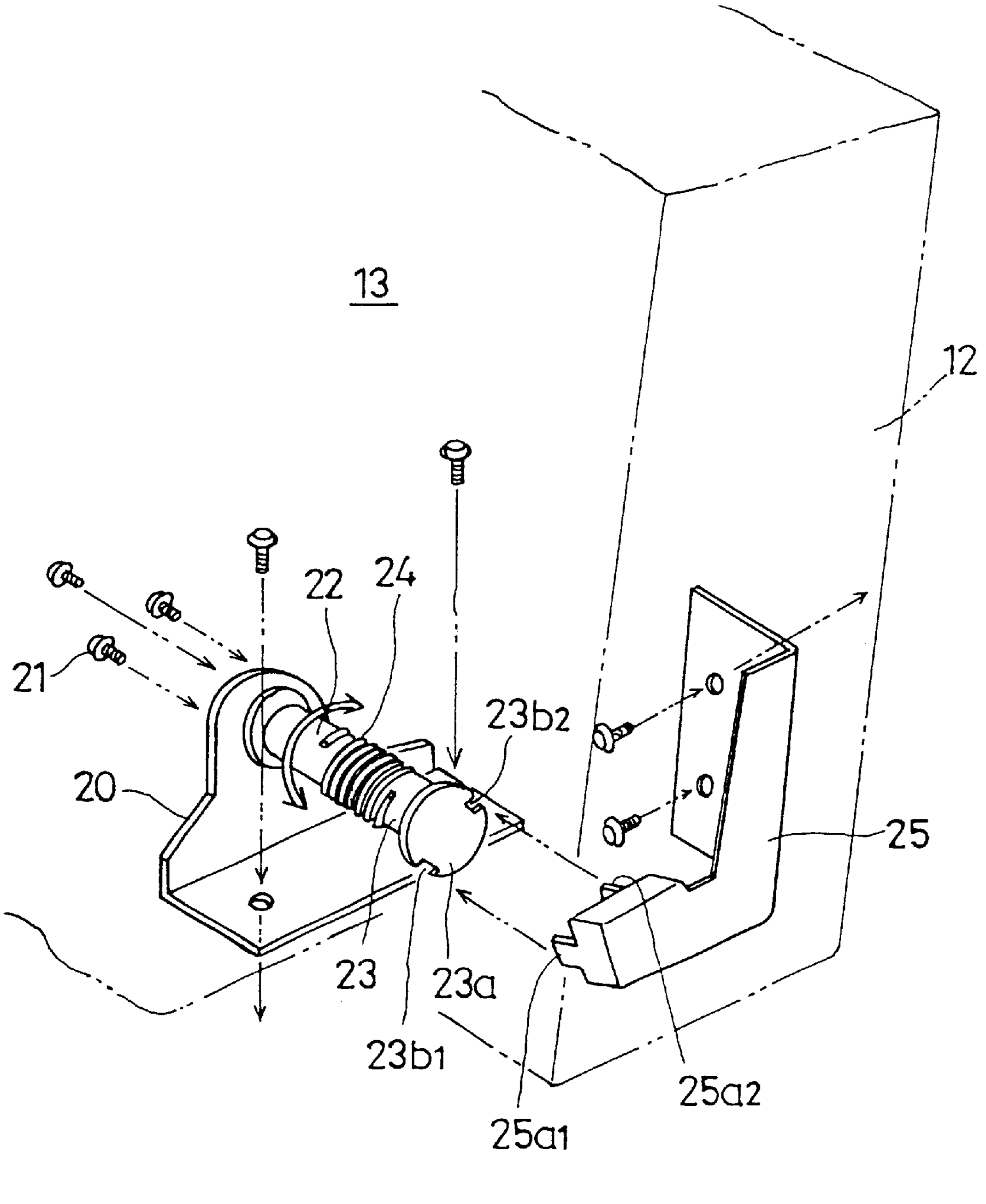
FIG. 2 shows a hinge module shown in FIGS. 1B and 1C.
Figure 4:
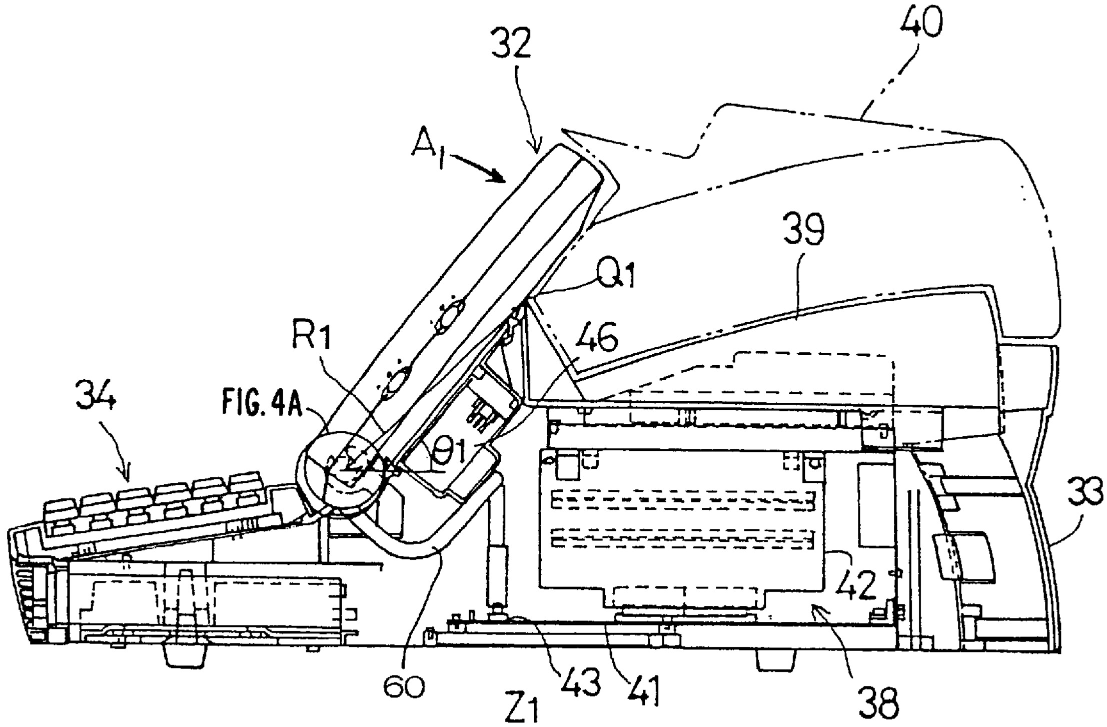
FIG. 4 shows a sectional view of the POS terminal unit shown in FIGS. 3A and 3B.
Figure 4A:
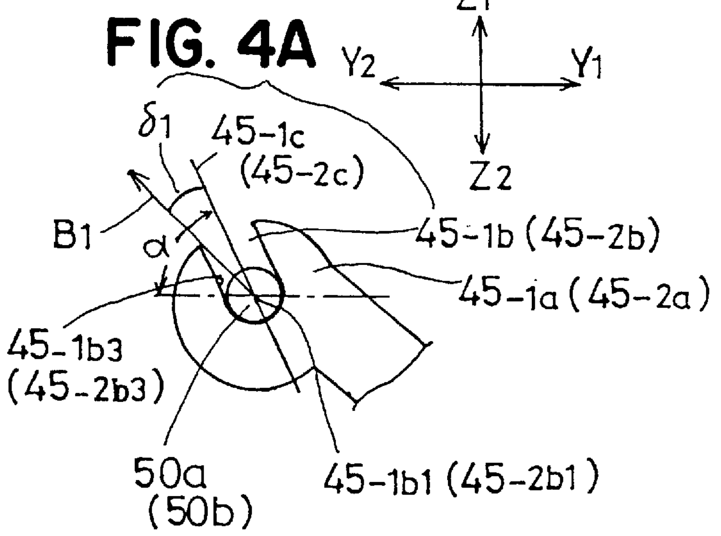

FIGS. 3A, 3B and 4 show a POS terminal unit 30 in a first embodiment of the present invention. The POS terminal unit 30 includes a body unit 31 and a display panel unit 32.

Figure 5A:
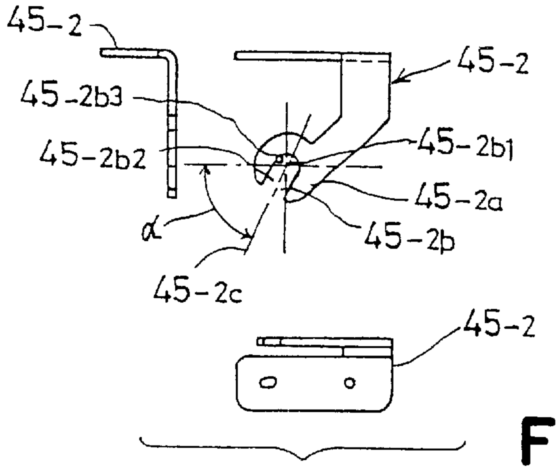
FIG. 5 shows a plan view of a body unit of the POS terminal unit shown in FIGS. 3A and 3B.
Figure 5:
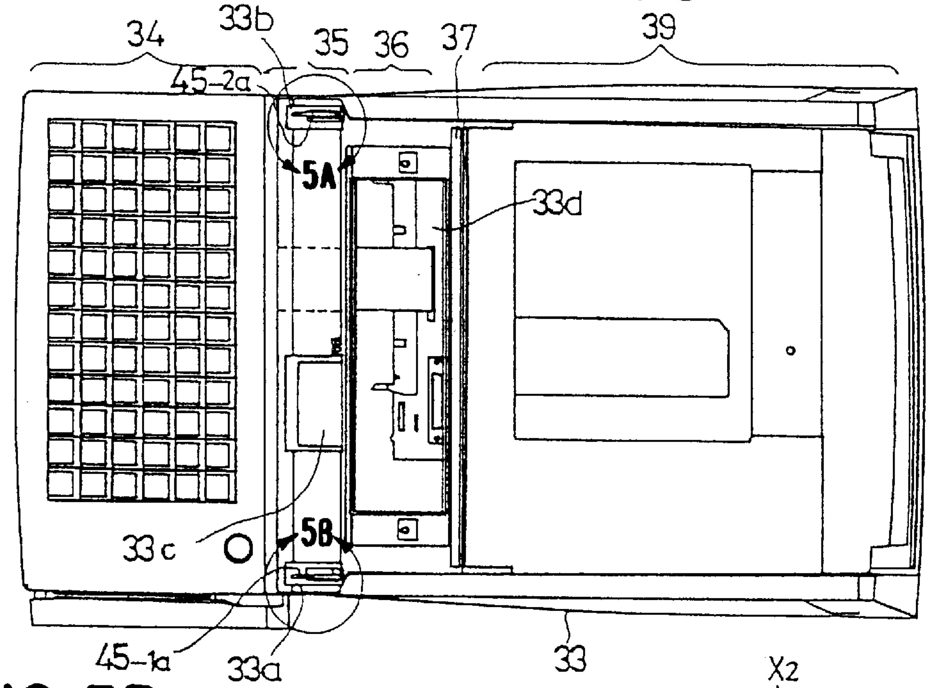
Figure 5B:
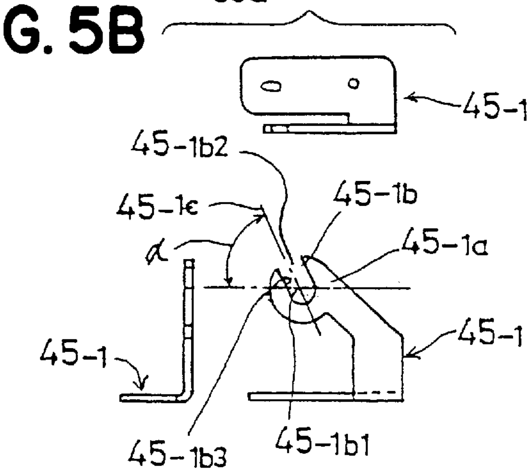

With reference also to FIG. 5, the body unit 31 includes, on or in a housing 33 (which is a synthetic-resin mold) from the front side to the rear side (Y1 direction), in sequence, a keyboard portion 34, a display-panel-unit attaching portion 35, a battery containing portion 36, a supporting-member receiving groove 37, and a printed-circuit-board module portion 38. The battery containing portion 36 and the supporting-member receiving groove 37 are provided on an inclined plane which is inclined upward (Z1 direction) the further it extends in the Y1 direction. The supporting-member receiving groove 37 is located at the top of this inclined plane, and extends in the X1–X2 directions. The printed-circuit-board module portion 38 has an arrangement in which a plurality of printed-circuit boards 42 are mounted on a horizontal printed-circuit board 41 in vertical positions. A connector 43 is mounted on the horizontal printed circuit board 41 at a position just below the battery containing portion 35. A top surface of the housing 33 at a position of the printed-circuit-board module portion 38 is used as a printer loading portion 39 at which a printer 40 is loaded.

The display-panel-unit attaching portion 35 has an arrangement in which shaft supporting members 45-1 and 45-2 are fixed to the housing 33 at the X1-direction end and the X2 direction end, respectively. Shaft supporting portions 45-1*a* and 45-2*a* of the shaft supporting members 45-1 and 45-2 project upward (Z1-direction) through slits 33*a* and 33*b* formed in the housing 33, respectively. U-shaped cut-outs 45-1*b* and 45-2*b* are formed in the shaft supporting portions 45-1*a* and 45-2*a,* respectively. These cut-outs 45-1*b* and 45-2*b* are formed so that the center lines 45-1*c* and 45-2*c* which extend from depth portions 45-1*b*1 and 45-2*b*1 to entrance-end portions 45-1*b*2 and 45-2*b*2 are inclined at an angle α (70 degrees) with respect to the horizontal lines which pass through the depth portions 45-1*b*1 and 45-2*b*1 and extend in the Y2 direction, respectively. The cut-outs 45-1*b* and 45-2*b* have side walls 45-1*b*3 and 45-2*b*3, respectively.

It is also possible that the shaft supporting members 45-1 and 45-2 are formed by portions of the housing 33.

An opening 33*c* for passing a cable therethrough is formed in the housing 33 at a position of the display-panel-unit attaching portion 35.

The battery containing portion 36 has an arrangement in which a battery containing box 46 is fitted into a large opening window 33*d* formed in the housing 33 and fixed thereto by using screws.

Figures 6A, 6B, 6C:
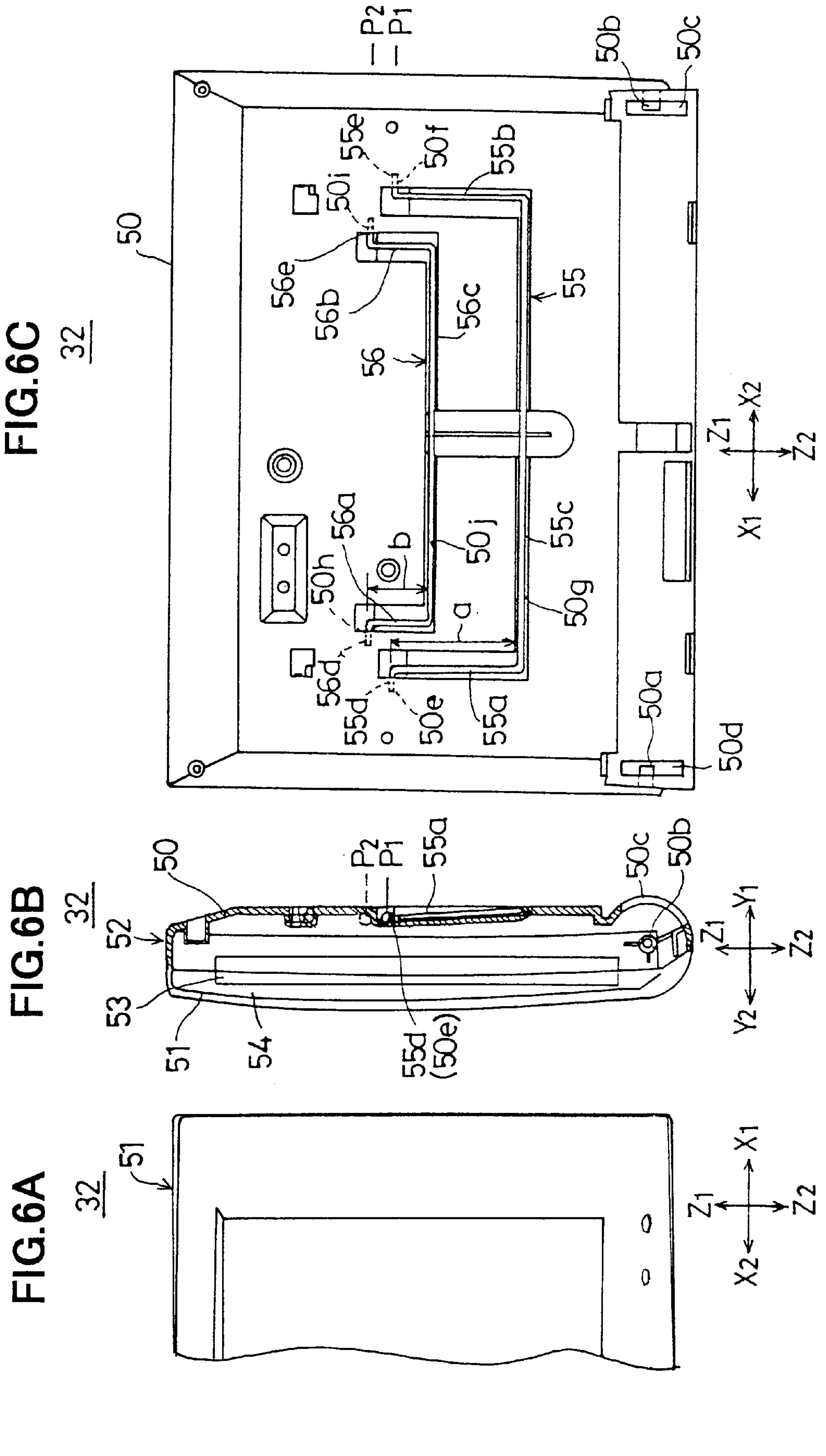
FIGS. 6A, 6B and 6C show a display panel unit of the POS terminal unit shown in FIGS. 3A and 3B.
Figure 7:
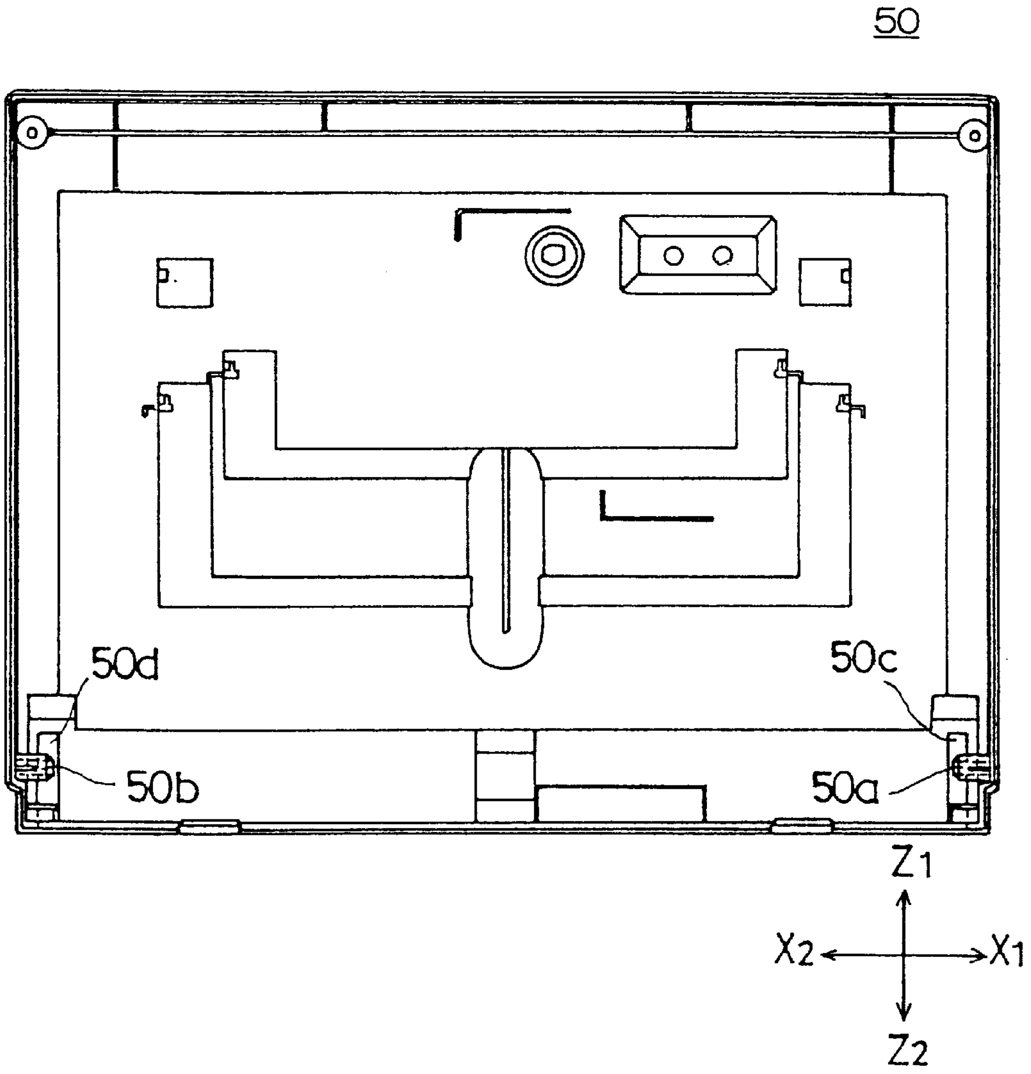
FIG. 7 shows a body of the display panel unit shown in FIGS. 6A, 6B and 6C.

As shown in FIGS. 6A, 6B and 6C, the display panel unit 32 has an arrangement in which, in a flat box 52 which includes a body 50 which is a synthetic resin mold and a frame-shaped cover 51 which is located in front of the body 51, a liquid crystal display device 53 and a touch panel 54 which covers the display screen of the liquid crystal display device 53 are incorporated. With reference also to FIG. 7, shafts 50*a* and 50*b* are formed on the body 50. The shafts 50*a* and 50*b* are located on the Z2-direction end, and, also, on the X1-direction end and the X2-direction end, respectively. Each of the shafts 50*a* and 50*b* projects inward. Further, slits 50*c* and 50*d* are formed in the body 50 at positions corresponding to the shafts 50*a* and 50*b*. The slits 50*c* and 50*d* are formed so that the shaft supporting portions 45-1*a* and 45-2*a* are inserted into the display panel unit 32 therethrough, respectively. As a result of forming the slits 50*c* and 50*d,* it is possible to fit the shafts 50*a* and 50*b* into the cut-outs 45-1*b* and 45-2*b* of the shaft supporting portions 45-1*a* and 45-2*a* through the slits 50*c* and 50*d,* respectively, without disassembling the display panel unit 32. Thus, assembling of the terminal unit can be performed easily.

Figure 8:
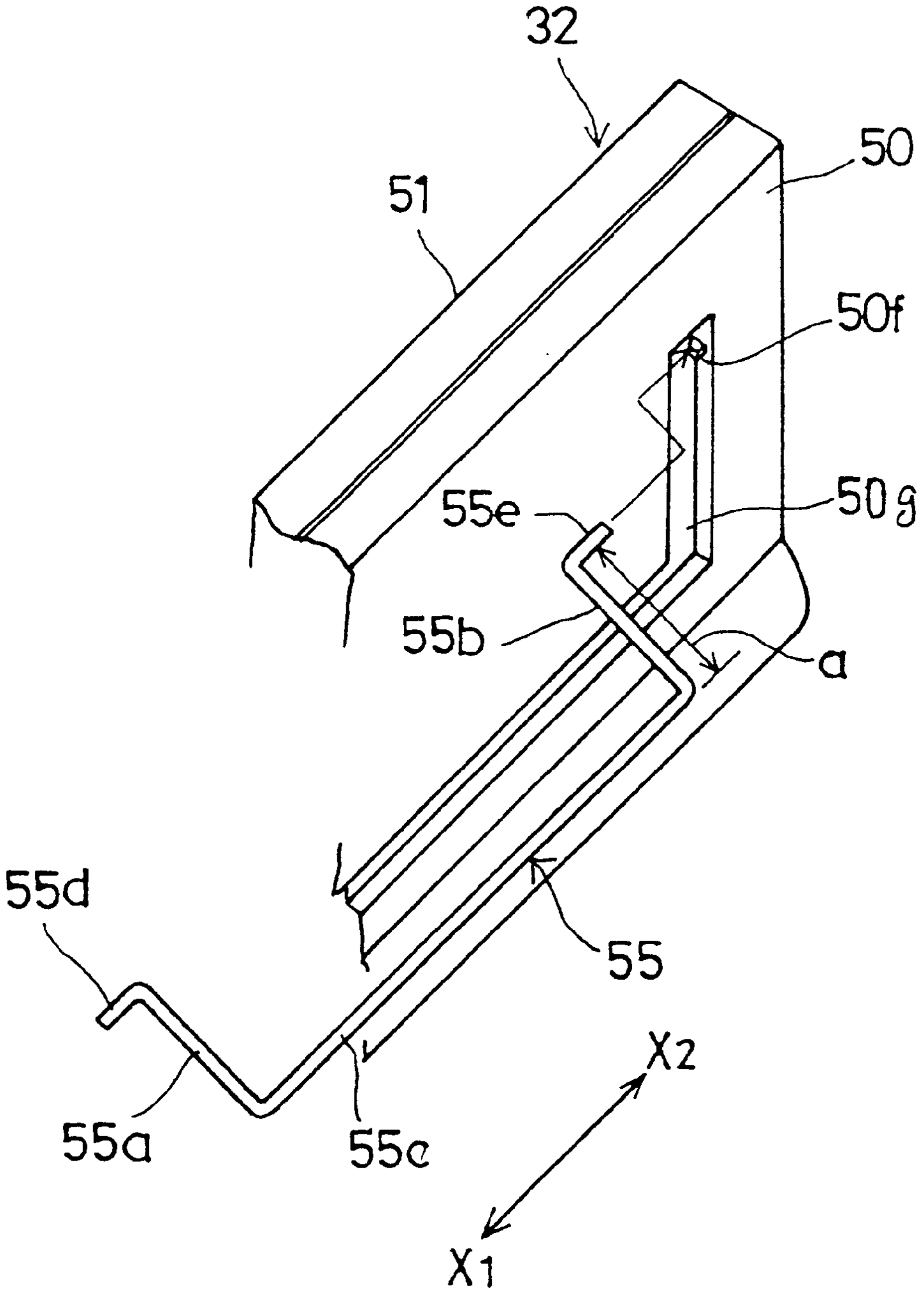
FIG. 8 shows attaching of a supporting member to the body of the display panel unit shown in FIG. 7.

On the rear surface of the body 50, as shown in FIG. 6C, two supporting members 55 and 56 are attached. Each of the supporting members 55 and 56 has an approximate U shape. The lengths of the arms of the supporting members 55 and 56 are different. As shown in FIG. 8, the supporting member 55 includes arm portions 55*a* and 55*b* at both ends thereof, each having the length 'a', a bridge portion 55*c* which connects the arm portions 55*a* and 55*b*, and shaft portions 55*d* and 55*e* which project outward from the arm portions 55*a* and 55*b*, respectively. The shaft portions 55*d* and 55*e* are inserted into holes 50*e* and 50*f* formed in the rear surface of the body 50, respectively. Thus, the supporting member 55 is attached to the body 50 rotatably about the holes 50*e* and 50*f*. When the supporting member 55 is not being used, the supporting member 55 is contained in a supporting-member containing groove portion 50*g* formed in the rear surface of the body 50. Similar to the supporting member 55, as shown in FIG. 6C, the supporting member 56 includes arm portions 56*a* and 56*b* at the both ends thereof, each having the length 'b' (approximately half the length 'a'), a bridge portion 56*c*, and shaft portions 56*d* and 56*e*. The shaft portions 56*d* and 56*e* are inserted into holes 50*h* and 50*i* formed in the rear surface of the body 50, respectively. Thus, the supporting member 56 is attached to the body 50 rotatably about the holes 50*h* and 50*i*. When the supporting member 56 is not being used, the supporting member 56 is contained in a supporting-member containing groove portion 50*j* formed in the rear surface of the body 50. In the Z1–Z2 directions, the holes 50*e* and 50*f* (shaft portions 55*d* and 55*e*) are located at the position P1, and the holes 50*h* and 50*i* (shaft portions 56*e* and 56*e*) are located at the position P2 which is slightly different from the position P1 in the Z1 direction.

By using such an arrangement in which a supporting member is attached to the display panel unit 32 as a result of the shaft portions of the supporting member being fitted into holes provided in the display panel unit 32, respectively, it is possible to attach the supporting member, selected from among a large number of supporting members, to the display panel unit, and, also, to change a position at which the supporting member is attached. As a result, it is possible to change the inclination angle of the display panel unit 32 in a larger number of steps, and it is possible to set the display panel unit 32 in the inclination angle in which an operator can operate the display panel unit 32 easily.

Assembling of the POS terminal unit 30 will now be described.

Figure 9:
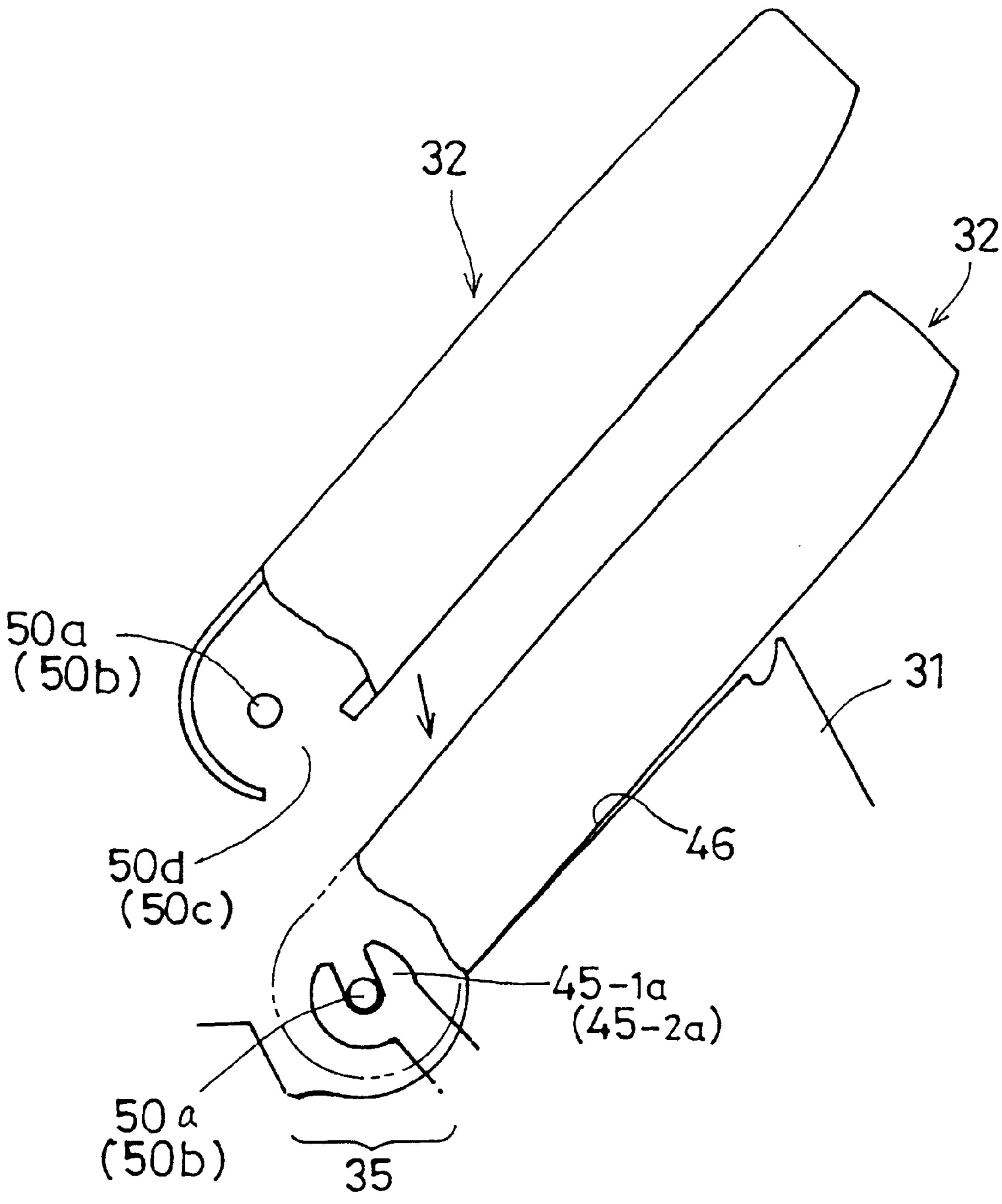
FIG. 9 illustrates attaching of the display panel unit to the body unit.

The body unit 31 and the display panel unit 32 are assembled separately. The display panel unit 32 is assembled to a condition in which the frame-shaped cover 51 has been fixed to the body 50. A cable 60 extends downward from the display panel unit 32. An assembler lowers the display panel portion 32 from a position above the body unit 31 carefully, as shown in FIG. 9. Then, the slits 50*c* and 50*d* are aligned with the shaft supporting portions 45-1*a* and 45-2*a*, respectively. Then, the shaft supporting portions 45-1*a* and 45-2*a* are inserted into the slits 50*c* and 50*d*, respectively. Then, the shafts 50*a* and 50*b* are fitted into the cut-outs 45-1*b* and 45-2*b* through the entrance portions 45-1*b*2 and 45-2*b*2, respectively, and, then, are fitted into the depth portions 45-1*b*1 and 45-2*b*1. Thus, the display panel unit 32 is combined with the body unit 31. The cable 60 is caused to pass through the opening 33*c* and is inserted into the housing 33. Then, the assembler inserts his or her hand into the housing 33 through the opening window 33*d*, and connects the cable 60 to the connector 43. Finally, the battery containing box 46 is attached to the housing 33.

Thus, assembling of the POS terminal unit 30 is completed through a few working processes. As a result, it is possible to deliver the POS terminal unit to a customer shortly after an order is made by the customer.

A condition in which the POS terminal unit 30 is used will now be described.

As shown in FIG. 4, the shafts 50*a* and 50*b* are rotatably supported by the depth portions 45-1*b*1 and 45-2*b*1 of the cut-outs 45-1*b* and 45-2*b* of the shaft supporting portions 45-1*a* and 45-1*b*, respectively. Thereby, the display panel unit 32 is rotated about the shafts 50*a* and 50*b* and the inclination angle of the display panel unit 32 can be changed.

In the POS terminal unit 30, the display panel unit 32 is adjusted to an angle position in which an operator can easily view the display screen and can easily operate the display panel unit 32. The POS terminal unit 30 may be used in a first using manner shown in FIG. 10, a second using manner shown in FIG. 11 or a third using manner shown in FIG. 4.

In the third using manner shown in FIG. 4, the POS terminal unit 30 is in a condition in which the display panel unit 32 is inclined so that the rear surface of the display panel unit 32 is in contact with the battery containing box 46. In this condition, the display panel unit 32 is inclined at an angle θ1 to horizontal.

When an operator operates the display panel unit 32 so that the operator pushes the display screen as indicated by the arrow A1 shown in FIG. 4 by using his or her finger, a clockwise moment about the point Q1 is exerted on the display panel unit 32. Thereby, force is applied to the shafts 50*a* and 50*b* such as to move the shafts 50*a* and 50*b* in the direction indicated by the arrow B1 (the tangential direction, at the positions of the shafts 50*a* and 50*b*, of an arc, the center of which is Q1 and the radius of which is R1). However, the direction of the arrow B1 is inclined at the angle δ1 to each of the above-mentioned center lines 45-1*c* and 45-2*c*. Therefore, the shaft 50*a* and 50*b* are pressed against the side walls 45-1*b*3 and 45-2*b*3 of the cut-outs 45-1*b* and 45-2*b*, respectively, and, thus, do not move at all, but are maintained in the depth portions 45-1*b*1 and 45-2*b*1, respectively. Thus, the display panel unit 32 is not wobbly, and the operator can operate the display panel unit 32 in a condition in which the display panel unit 32 is stable.

Figure 10:
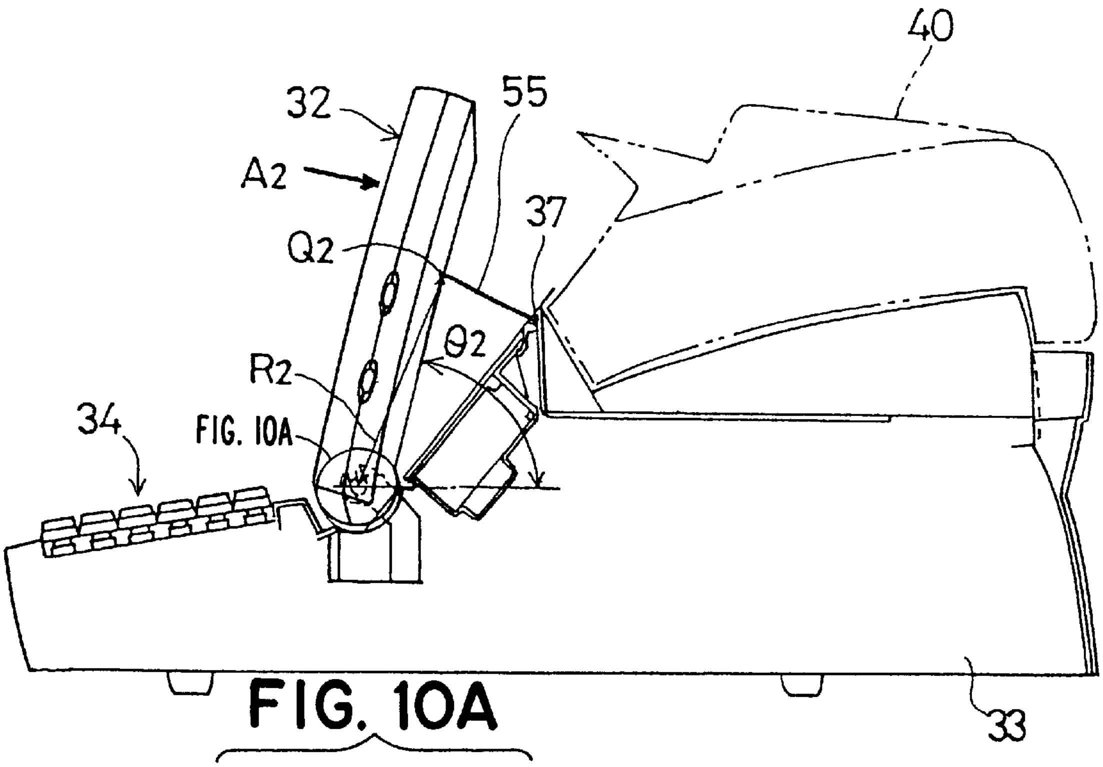
FIG. 10 shows a first using manner of the POS terminal unit.
Figure 10A:
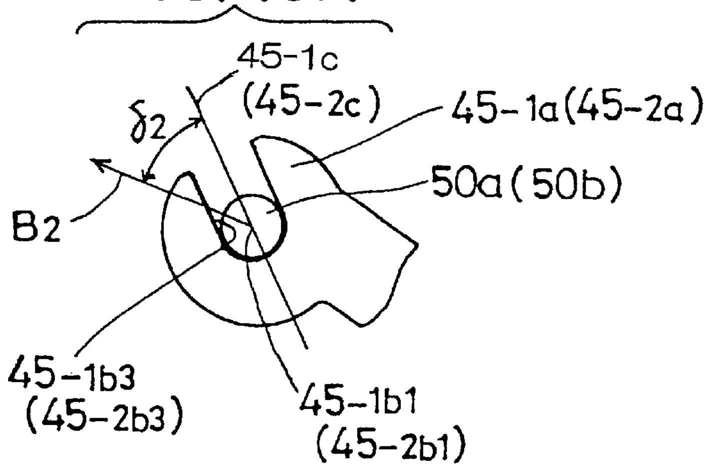

In the first using manner shown in FIG. 10, the POS terminal unit 30 is in a condition in which the display panel unit 32 is raised, the supporting member 55 is pulled and raised, and the bridge portion of 55*c* of the supporting member 55 is fitted into the supporting-member receiving groove 37. In this condition, the display panel unit 32 is inclined at the angle θ2 (>θ1) to horizontal.

When an operator operates the display panel unit 32 so that the operator pushes the display screen as indicated by the arrow A2 shown in FIG. 10 by using his or her finger, a clockwise moment about the point Q2 is exerted on the display panel unit 32. Thereby, force is applied to the shafts 50*a* and 50*b* such as to move the shafts 50*a* and 50*b* in the direction indicated by the arrow B2 (the tangential direction, at the positions of the shafts 50*a* and 50*b*, of an arc, the center of which is Q2 and the radius of which is R2). However, the direction of the arrow B2 is inclined at the angle δ2 to each of the above-mentioned center lines 45-1*c* and 45-2*c*. Therefore, the shaft 50*a* and 50*b* are pressed against the side walls 45-1*b*3 and 45-2*b*3 of the cut-outs 45-1*b* and 45-2*b*, respectively, and, thus, do not move at all, but are maintained in the depth portions 45-1*b*1 and 45-2*b*1, respectively. Thus, the display panel unit 32 is not wobbly, and the operator can operate the display panel unit 32 in a condition in which the display panel unit 32 is stable in the raised and inclined position. The angle δ2 is larger than the above-mentioned angle δ1. As a result, the shafts 50*a* and 50*b* are pressed against the side walls 45-1*b*3 and 45-2*b*3, respectively, in the direction closer to the right angle.

Therefore, movement of the shafts 50*a* and 50*b* are prevented more positively, and the display panel unit 32 is maintained in this position more firmly. Thus, the portion at which the display panel unit is connected to the body unit is prevented from being wobbly more positively, and it is possible to more stably perform an operation on the display panel unit, that is, push the display panel unit.

Figure 11:
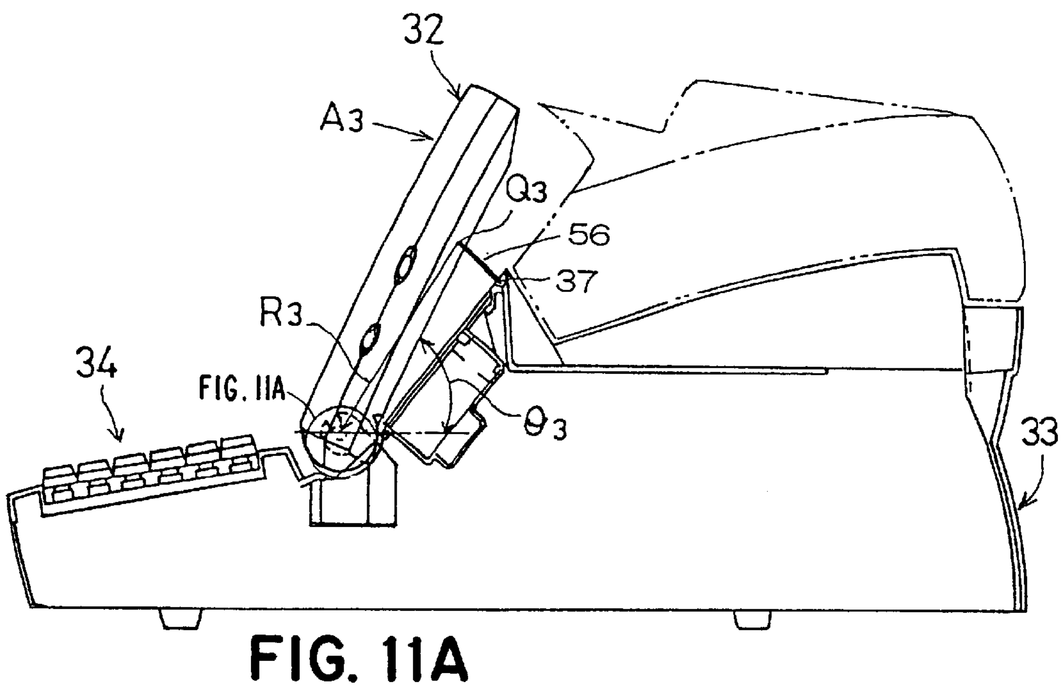
FIG. 11 shows a second using manner of the POS terminal unit.
Figure 11A:
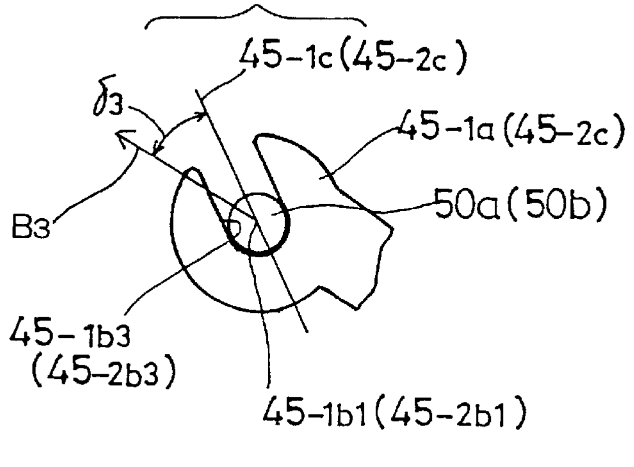

In the second using manner shown in FIG. 11, the POS terminal unit 30 is in a condition in which, instead of the supporting member 55, the supporting member 56 is pulled and raised, and the bridge portion 56*c* of the supporting member 56 is fitted into the supporting member receiving groove 37. In this condition, the display panel unit 32 is inclined at the angle θ3 to horizontal. The angle θ3 is larger than the angle θ1 and smaller than the angle θ2.

When an operator operates the display panel unit 32 so that the operator pushes the display screen as indicated by the arrow A3 shown in FIG. 11 by using his or her finger, a clockwise moment about the point Q3 is exerted on the display panel unit 32. Thereby, force is applied to the shafts 50*a* and 50*b* such as to move the shafts 50*a* and 50*b* in the direction indicated by the arrow B3 (the tangential direction, at the positions of the shafts 50*a* and 50*b*, of an arc, the center of which is Q3 and the radius of which is R3). However, the direction of the arrow B3 is inclined at the angle δ3 to each of the above-mentioned center lines 45-1*c* and 45-2*c*. Therefore, the shaft 50*a* and 50*b* are pressed against the side walls 45-1*b*3 and 45-2*b*3 of the cut-outs 45-1*b* and 45-2*b*, respectively, and, thus, do not move at all, but are maintained in the depth portions 45-1*b*1 and 45-2*b*1, respectively. Thus, the display panel unit 32 is not wobbly, and the operator can operate the display panel unit 32 in a condition in which the display panel unit 32 is stable in the raised and inclined position. The angle δ3 is larger than the above-mentioned angle δ1. As a result, also in this case, movement of the shafts 50*a* and 50*b* are prevented more positively, and the display panel unit 32 is maintained in this position more firmly. Thus, the portion at which the display panel unit 32 is connected to the body unit 31 is prevented from being wobbly more positively, and it is possible to more stably perform an operation on the display panel unit 32, that is, push the display panel unit 32.

Thus, by selecting one of the two supporting members 55 and 56 and using the thus-selected one, it is possible to change the inclination angle of the display panel unit 32 in two steps. Further, the direction B2 or B3 in which force is applied to the shafts 50*a* and 50*b* when the display panel unit 32 is operated is different from each of the center lines 45-1*c* and 45-2*c* of the cut-outs 45-1*b* and 45-2*b* by the predetermined angle δ1 or δ2 when any one of the two supporting members 55 and 56 is fitted into the supporting-member receiving groove 37 provided in the body unit 31 and thereby the display panel unit 32 enters the using condition. Therefore, when the inclination angle of the display panel unit 32 is set to any angle by selecting one of the two supporting members 55 and 56 and using the thus-selected one, the shafts 50*a* and 50*b* are prevented from moving in the direction in which the shafts 50*a* and 50*b* slip out of the cut-outs 45-1*b* and 45-2*b*, respectively. Thus, the portion at which the display panel unit 32 is connected to the body unit 31 is prevented from being wobbly more positively, and it is possible to more stably perform an operation on the display panel unit 32, that is, push the display panel unit 32.

Figure 12:
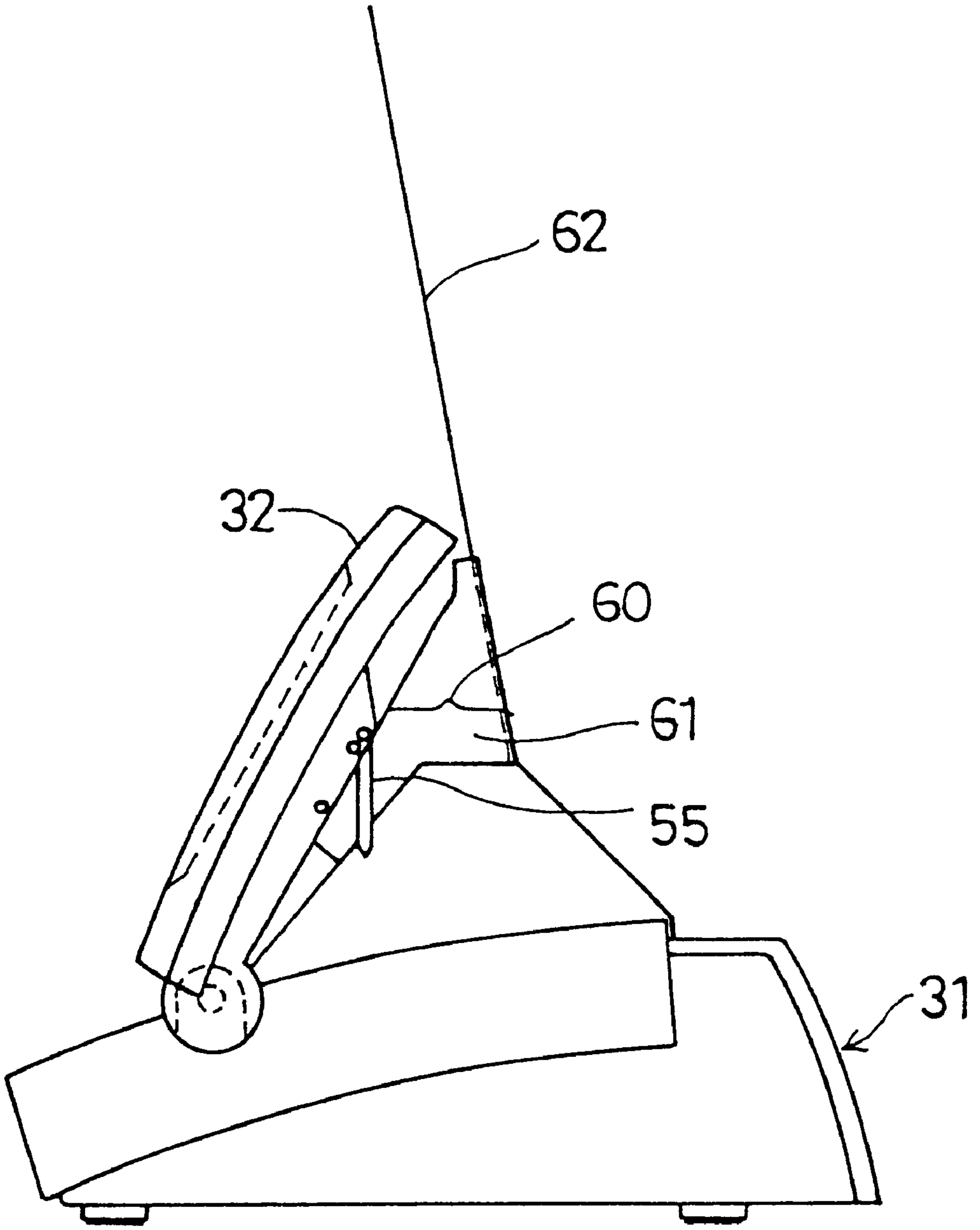
FIG. 12 roughly shows another using manner of the POS terminal unit.

FIG. 12 roughly shows another using manner of the POS terminal unit 30. As shown in FIG. 12, a stand 61 is placed in a space 60 which is formed on the rear side of the display panel unit 32 which has been raised. A panel 62 for a sales purpose such as a POP, a menu or the like is set on the stand 61. Thus, the space 60 formed as a result of the display panel unit 32 being raised is effectively used for disposing the stand 61 there.

A work for detaching the display panel unit 32 in a case where maintenance is performed so that the display panel unit 32 is replaced will now be described.

The display panel unit 32 is raised, the battery containing box 46 is detached from the housing 33, a hand is inserted through the opening window 33*d* and the cable 60 is removed from the connector 43 by using the inserted hand. Then, the display panel unit 32 is pulled up in the direction reverse to that in which the display panel unit 32 was attached to the body unit 31 as shown in FIG. 9. Thereby, the shafts 50*a* and 50*b* slip off from the U-shaped cut-outs 45-1*b* and 45-2*b*, respectively, and, thus, the display panel unit 32 is detached from the body unit 31.

It is possible that the above-mentioned angle α is determined to be an angle which is smaller than that in the case of the above-described embodiment, for example, 40 degrees. In this case, in the third using manner shown in FIG. 4, the angle between the direction in which force is applied to the shafts 50*a* and 50*b* such as to move the shafts 50*a* and 50*b* and each of the center lines 45-1*c* and 45-2*c* is near to zero. However, the angle between the direction in which force is applied to the shafts 50*a* and 50*b* such as to move the shafts 50*a* and 50*b* and each of the center lines 45-1*c* and 45-2*c* has a substantial value when the POS terminal unit 30 is used in the first using manner shown in FIG. 10 in which the supporting member 55 is pulled and raised or when the POS terminal unit 30 is used in the second using manner shown in FIG. 11 in which the supporting member 56 is pulled and raised.

Figure 13:
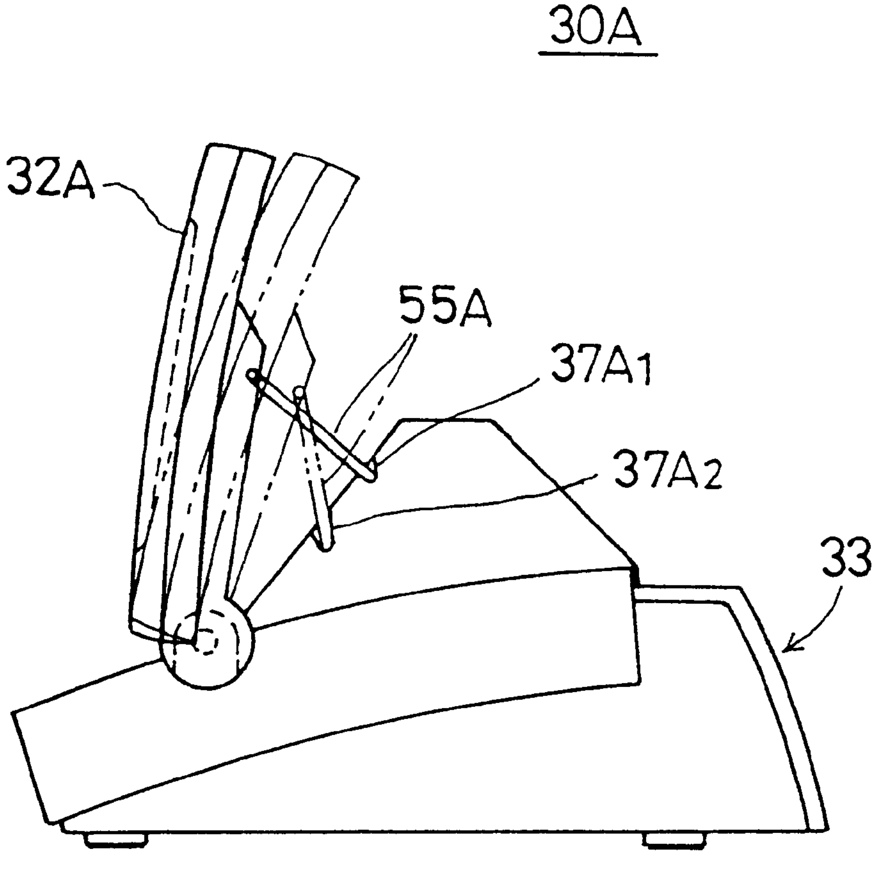
FIG. 13 roughly shows a POS terminal unit in a second embodiment of the present invention.

FIG. 13 roughly shows a POS terminal unit 30A in a second embodiment of the present invention. Two supporting-member receiving grooves 37A1 and 37A2 are formed in a body unit 31A. One supporting member 55A is attached to a display panel unit 32A. According to whether the supporting member 55A is fitted into the supporting-member receiving groove 37A1 or the supporting-member receiving groove 37A2, the inclination angle of the display panel unit 32A to horizontal can be changed. That is, when the supporting member 55A is fitted into the supporting-member receiving groove 37A1, the display panel unit 32A is inclined at a first angle to horizontal. When the supporting member 55A is fitted into the supporting-member receiving groove 37A2, the display panel unit 32A is inclined at a second angle, different from the first angle, to horizontal.

Thus, by selecting one of the two supporting-member receiving grooves 37A1 and 37A2 and using the thus-selected one, it is possible to change the inclination angle of the display panel unit 32 in two steps. Further, the direction in which force is applied to the shafts 50*a* and 50*b* when the display panel unit 32 is operated is different from each of the center lines 45-1*c* and 45-2*c* of the cut-outs 45-1*b* and 45-2*b* by the predetermined angle when the supporting member 55A is fitted into any one of the supporting-member receiving grooves 37A1 and 37A2 and thereby the display panel unit 32 enters the using condition. Therefore, when the inclination angle of the display panel unit 32 is set to any angle by selecting one of the two supporting-member receiving grooves 37A1 and 37A2 and using the thus-selected one, the shafts 50*a* and 50*b* are prevented from moving in the direction in which the shafts 50*a* and 50*b* slip out of the cut-outs 45-1*b* and 45-2*b*, respectively, by the same reason as that described with reference to FIGS. 10 and 11. Thus, the portion at which the display panel unit 32 is connected to the body unit 31 is prevented from being wobbly more positively, and it is possible to more stably perform an operation on the display panel unit 32, that is, push the display panel unit 32.

Figure 14:
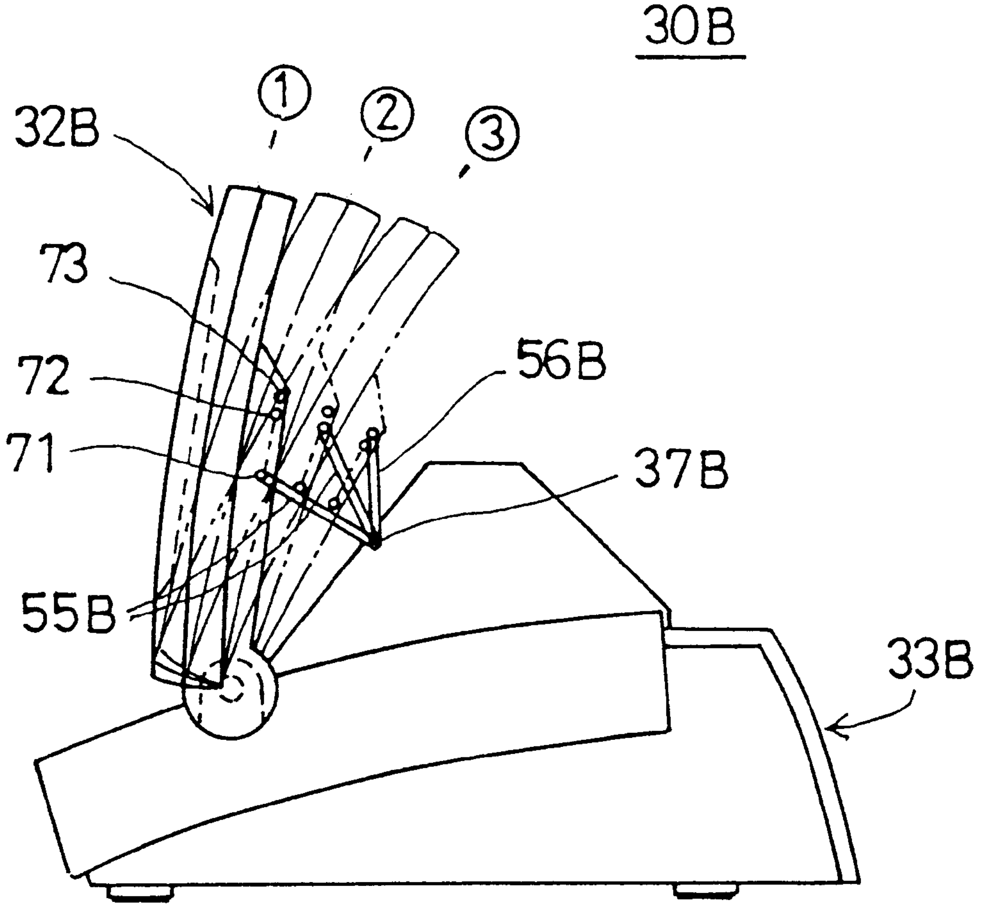
FIG. 14 roughly shows a POS terminal unit in a third embodiment of the present invention.

FIG. 14 roughly shows a POS terminal unit 30B in a third embodiment of the present invention. A supporting-member receiving groove 37B is formed in the body unit 31B. Three pairs of holes 71, 72 and 73 are formed in the display panel unit 32B at different positions. An operator selects a supporting member having a predetermined arm length, and inserts the shaft portions of the supporting member into a predetermined pair of holes, selected from among the three pairs of the holes 71, 72 and 73, respectively. Thus, the supporting member is attached to the display panel unit 32B. In FIG. 14, ① shows a condition in which the shaft portions of a supporting member 55B having long arm portions are inserted into the pair of the holes 71, thus the supporting member 55B being attached to the display panel unit 32B, and the bridge portion of the supporting member 55B is fitted into the supporting-member receiving groove 37B of the body unit 31B. ② shows a condition in which the shaft portions of a supporting member 55B having long arm portions are inserted into the pair of the holes 72, thus the supporting member 55B being attached to the display panel unit 32B, and the bridge portion of the supporting member 55B is fitted into the supporting-member receiving groove 37B of the body unit 31B. ③ shows a condition in which the shaft portions of a supporting member 55B having short arm portions are inserted into the pair of the holes 73, thus the supporting member 55B being attached to the display panel unit 32B, and the bridge portion of the supporting member 55B is fitted into the supporting-member receiving groove 37B of the body unit 31B. Thus the inclination angle of the display panel portion 32B can be changed, as shown in FIG. 14, as a result of the POS terminal unit 30B entering the conditions ①, ② and ③.

Thus, in comparison to the case where the plurality of supporting members are previously attached to the rear surface of the display panel unit, it is possible to change the inclination angle of the display panel unit 32B in finer steps as a result of selecting a supporting member from among a larger number of supporting members and attaching the thus-selected supporting member to the display panel unit 32B or as a result of changing a position at which the supporting member is attached. Thus, it is possible to set the display panel unit 32B to an angle position in which an operator can easily operate the display panel unit 32B.

Application of the present invention is not limited to the application to the POS terminal unit. It is also possible to apply the present invention to another kind of a terminal unit.

Further, the present invention is not limited to the above-described embodiments, and variations and modifications may be made without departing from the scope of the present invention.

The contents of the basic Japanese Patent Application No. 10-190619, filed on Jul. 6, 1998, are hereby incorporated by reference.

What is claimed is:

1. A terminal unit, comprising:

a body unit; and a display panel unit which is attached to said body unit in a manner in which an inclination angle of said display unit is changed, wherein:

said display panel unit has a shaft;

said body unit has a shaft supporting portion which has a cut-out having an entrance portion;

said shaft is caused to pass through said entrance portion of said cut-out of said shaft supporting portion and is fitted into a depth portion of said cut-out, said display panel unit thus being attached to said body unit; and the direction in which force is applied to said shaft when said display panel unit is operated is different from the center line of said cut-out by a predetermined angle so that said display panel unit is easily assembled to said body unit, and said display panel unit is not easily removed from said body unit through inclining operation of said display panel unit with respect to said body unit.

2. The terminal unit as claimed in claim 1, wherein said display panel unit has said shaft inside thereof and a body of said display panel unit has a slit at a position corresponding to said shaft, said shaft supporting portion being inserted into said display panel unit through said slit.

3. The terminal unit as claimed in claim 1, wherein:

said display panel unit has a supporting member attached to a rear surface thereof, said display panel unit entering a using condition as a result of said supporting member being raised and fitted into a supporting-member receiving portion provided in said body unit; and the direction in which force is applied to said shaft when said display panel unit is operated in said using condition is different from the center line of said cut-out by a predetermined angle.

4. The terminal unit as claimed in claim 1, wherein:

said display panel unit has a supporting member attached to a rear surface thereof; and an angle by which the direction in which force is applied to said shaft when said display panel unit is operated is different from the center line of said cut-out, such that the angle is larger in a case where said supporting member is raised and fitted into a supporting-member receiving portion provided in said body unit than in a case where said supporting member is not raised.

5. The terminal unit as claimed in claim 1, wherein:

said display panel unit has a plurality of supporting members attached on a rear surface thereof so that the inclination angle of said display panel unit can be changed in a plurality of steps by changing the supporting member which is used; and the direction in which force is applied to said shaft when said display panel unit is operated is different from the center line of said cut-out by a predetermined angle when any one of said plurality of supporting members is fitted into a supporting-member receiving portion provided in said body unit and thereby said display panel unit enters a using condition.

6. The terminal unit as claimed in claim 1, wherein:

said display panel unit has a supporting member attached to a rear surface thereof;

said body unit has supporting-member receiving portions at a plurality of positions so that the inclination angle of said display panel unit can be changed in a plurality of steps by changing the supporting-member receiving portion which is used;

the direction in which force is applied to said shaft when said display panel unit is operated is different from the center line of said cut-out by a predetermined angle when said supporting member is fitted into any one of said supporting-member receiving portions and thereby said display panel unit enters a using condition.

7. The terminal unit as claimed in claim 1, wherein:

said display panel unit has a supporting-member attaching hole in a rear surface thereof, said display panel unit enter a using condition as a result of a supporting member being attached to said display panel unit by using said supporting-member attaching hole and said supporting member being fitted into a supporting member receiving portion provided in said body unit; and the direction in which force is applied to said shaft when said display panel unit is operated in said using condition is different from the center line of said cut-out by a predetermined angle.

8. The terminal unit as claimed in claim 3, wherein a stand for supporting a panel for a sales purpose is provided in a space which is formed on the rear side of said display panel unit, said space being formed in a condition in which said supporting member is fitted into said supporting member receiving portion of said body unit, such that said display panel unit is raised, and said display panel unit enters said using condition.

9. The terminal unit as claimed in claim 1, wherein said predetermined angle is large enough so that said shaft is pressed against a side wall of said cut-out and is prevented from slipping out of said cut-out when said display panel unit is operated and thereby the force is applied to said shaft in said direction.

* * * * *